(12) United States Patent
Root et al.

(10) Patent No.: US 6,507,978 B1
(45) Date of Patent: Jan. 21, 2003

(54) HOUSING FOR ELECTRICAL COMPONENTS

(75) Inventors: Paul Root, Bad Endbach; Markus Neuhof, Ehringshausen-Niederlemp, both of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 53 days.

(21) Appl. No.: 09/634,187

(22) Filed: Aug. 9, 2000

(30) Foreign Application Priority Data

Aug. 11, 1999 (DE) .......................... 199 37 966

(51) Int. Cl.⁷ ............................................. B65D 25/28
(52) U.S. Cl. ...................................... 16/410; 403/374.1
(58) Field of Search .................. 16/410, 444, 446, 16/443, DIG. 41, 436, 415, 421; 403/374.1, 374.2, 374.3, 374.4, 167; 292/327

(56) References Cited

U.S. PATENT DOCUMENTS

| | | | | |
|---|---|---|---|---|
| 2,672,103 A | * | 3/1954 | Hohmes ....................... | 16/443 |
| 4,658,467 A | * | 4/1987 | Stolarz ........................ | 16/114.1 |
| 4,912,809 A | * | 4/1990 | Scheuer ........................ | 16/443 |
| 5,144,718 A | * | 9/1992 | Ozawa .................. | 16/DIG. 41 |
| 5,606,772 A | * | 3/1997 | Ilic .............................. | 16/421 |
| 5,647,685 A | * | 7/1997 | Fukui et al. .............. | 403/374.4 |
| 5,810,502 A | * | 9/1998 | Reitz et al. .................. | 403/257 |
| 5,931,525 A | * | 8/1999 | Rickabus ...................... | 16/444 |
| 6,003,202 A | * | 12/1999 | Dauterive .............. | 16/DIG. 41 |

FOREIGN PATENT DOCUMENTS

DE                40 34 773 C1        1/1992

\* cited by examiner

*Primary Examiner*—Anthony Knight
*Assistant Examiner*—Doug Hutton
(74) *Attorney, Agent, or Firm*—Pauley Petersen Kinne & Erickson

(57) ABSTRACT

A housing for receiving electrical components, having a housing body with two lateral walls, a bottom and a cover, wherein a handle arrangement with at least one handle is fastened on the exterior of the housing body. The handle has a base handle element with end pieces on both ends, to each of which a fastening element is connected. The fastening elements are connected with the housing body. In order to provide a visually pleasant connecting device between the base handle element and the fastening elements, wherein simultaneously diverse handle design variations can be created in a simple way with small constructive outlay, the base handle element is designed as a curved or straight pipe section. Clamping pieces of the fastening elements are inserted into the pipe section through open ends of the end pieces. The clamping pieces have an adjusting member, which can be adjusted with respect to the clamping piece by a fastening arrangement. The clamping piece is held, braced against the interior cross section of the pipe section, by the adjusting member and the fastening arrangement.

16 Claims, 4 Drawing Sheets

HOUSING FOR ELECTRICAL COMPONENTS

BACKGROUND OF THE INVENTION

1. Field of the Invention

This invention relates to a housing for receiving electrical components, having a housing body with two lateral walls, a bottom and a cover, wherein a handle arrangement with at least one handle is fastened on an exterior of the housing body, wherein the handle has a base handle element with end pieces on both ends, to each of which a fastening element is connected, and wherein the fastening elements are connected with the housing body.

2. Description of Prior Art

A housing is known from German Patent Reference DE 40 34 773 C1. This housing has a carrying arrangement with two U-shaped handles. The handles have a base handle element and two fastening elements. On their free ends, these fastening elements are connected with the module housing in the area of two adjoining corner edges of the module housing. The handles project away from the corner edges in such a way that their handle levels are at obtuse angles with respect to the associated lateral wall, as well as to the associated cover and bottom.

SUMMARY OF THE INVENTION

It is one object of this invention to provide a housing of the type previously mentioned, wherein a visually pleasant connecting device is between the base handle element and the fastening elements, and wherein diverse handle design variations can be easily created with small constructive outlay.

This object is attained with a base handle element designed as a curved or straight pipe section. Clamping pieces of the fastening elements are inserted into the pipe section through the open ends of the end pieces. The clamping pieces have an adjusting member, which can be adjusted with respect to the clamping piece by a fastening arrangement, and the clamping piece is held, braced against the interior cross section of the pipe section, by the adjusting member and the fastening arrangement.

With this design the connecting device is displaced into the hollow chamber enclosed by the base handle element and is thus not visible from the outside. It is thus possible to provide a visually pleasant construction. The base handle element can be simply processed, cut to size from a semi-finished steel pipe, for example, and then bent into the desired shape. Various design options can thus be achieved, wherein the connecting device between the base element and the fastening element remains the same.

In order to obtain large gripping forces, and therefore a secure connection, the clamping piece can have an inclined face, on which the adjusting member glides with an opposing face. The inclined face slopes with respect to the center longitudinal axis of the end pieces. The handle can also be particularly designed in such a way that the adjusting member has a threaded receiver with a thread axis extending parallel with respect to the center longitudinal axis of the related end section or aligned with it. The fastening element has a screw receiver, which is aligned with the threaded receiver, and a fastening screw designed as a fastening arrangement, and is passed through the screw receiver and screwed into the threaded receiver.

To be able to exactly align the fastening element with the base handle element the fastening element has a pin, which is inserted into the end section and which has outer contours that are matched to the interior cross section of the end section. A stop collar is formed on the end section which, in the inserted state of the pin, rests against the end of the end section.

Fastening of the handle on the housing can be designed so that the fastening element has a fastening section with at least one screw receiver. The fastening section is surrounded, at least in the area of the screw receiver, by an enclosure of the fastening element. The enclosure has an opening which provides access to the screw receiver. The opening can be closed by a cover. Together with the cover, the enclosure forms a receptacle in which a fastening screw, which is used for connecting the handle with the housing body, can be housed hidden from sight.

Also, the screw head of the fastening screw, which is designed as the fastening arrangement, projects into the area of the enclosure and is accessible through the opening and/or a tool holding fixture of the fastening section.

To produce a sealed attachment of the handle on the housing body, on its side facing the housing body, the fastening element has a seal receiver into which a seal is inserted, preferably glued in, which is seated on one of the lateral walls, the cover or the bottom which has a screw receiver, and which seals the area around this screw receiver.

A possible design of the handle can be such that the base handle element of the handle extends parallel with respect to the related lateral wall, bottom or cover of the housing body. The end sections are bent away from the base handle element in the direction toward the housing body. The flat fastening faces of the fastening elements rest on a wall of the housing body.

The base handle element can have two legs extending at right angles with respect to each other, from each end of which an end section is bent off. The fastening faces of the two fastening elements are located at right angles to each other. In this case, the one fastening element can be fastened to a lateral wall, the other fastening element on the bottom or cover of the housing, resulting in a handle which bridges an edge of the housing.

The base handle element can also have two legs extending at right angles with respect to each other, from each end of which an end section is bent off. The fastening faces of the two fastening elements are aligned parallel with respect to each other and are located in a common plane.

BRIEF DESCRIPTION OF THE DRAWINGS

This invention will be explained in greater detail by reference to preferred embodiments represented in the drawings, wherein.

DESCRIPTION OF PREFERRED EMBODIMENTS

Figure 1:
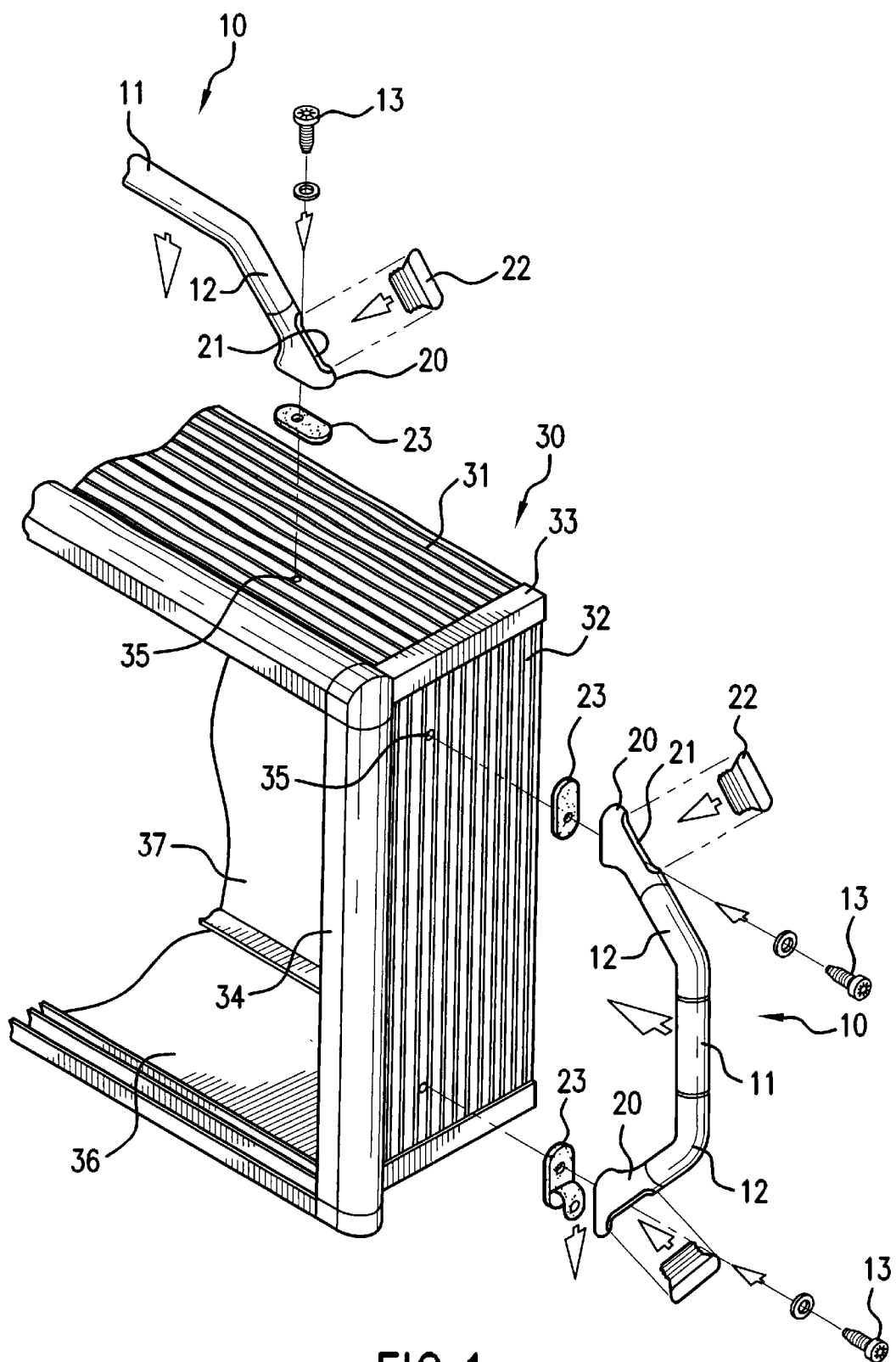
FIG. 1 is a perspective exploded lateral view a part of a housing, on which two handles are to be installed.

A housing with a housing body 30 is represented in FIG. 1. The housing body 30 has two vertical lateral walls 32 connected with each other by means of a horizontal bottom 36 and a cover 31. Profiled connection sections 33, which extend in the direction of the depth of the housing, are provided for connecting the lateral walls 32 with the bottom 36 or the cover 31. The open front of the housing body 30 is framed by a front frame 34. A housing door, not represented in the drawings, can be hinged on the front frame 34. The housing is closed at the back by a back wall 37. Handles 10 can be attached to the sides of the housing body 30. Threaded receivers 35 are thus provided in the lateral walls 32 and in the cover 31, possibly also in the bottom 36. Details of the design of the handles 10 are shown in FIG. 2.

Figure 2:
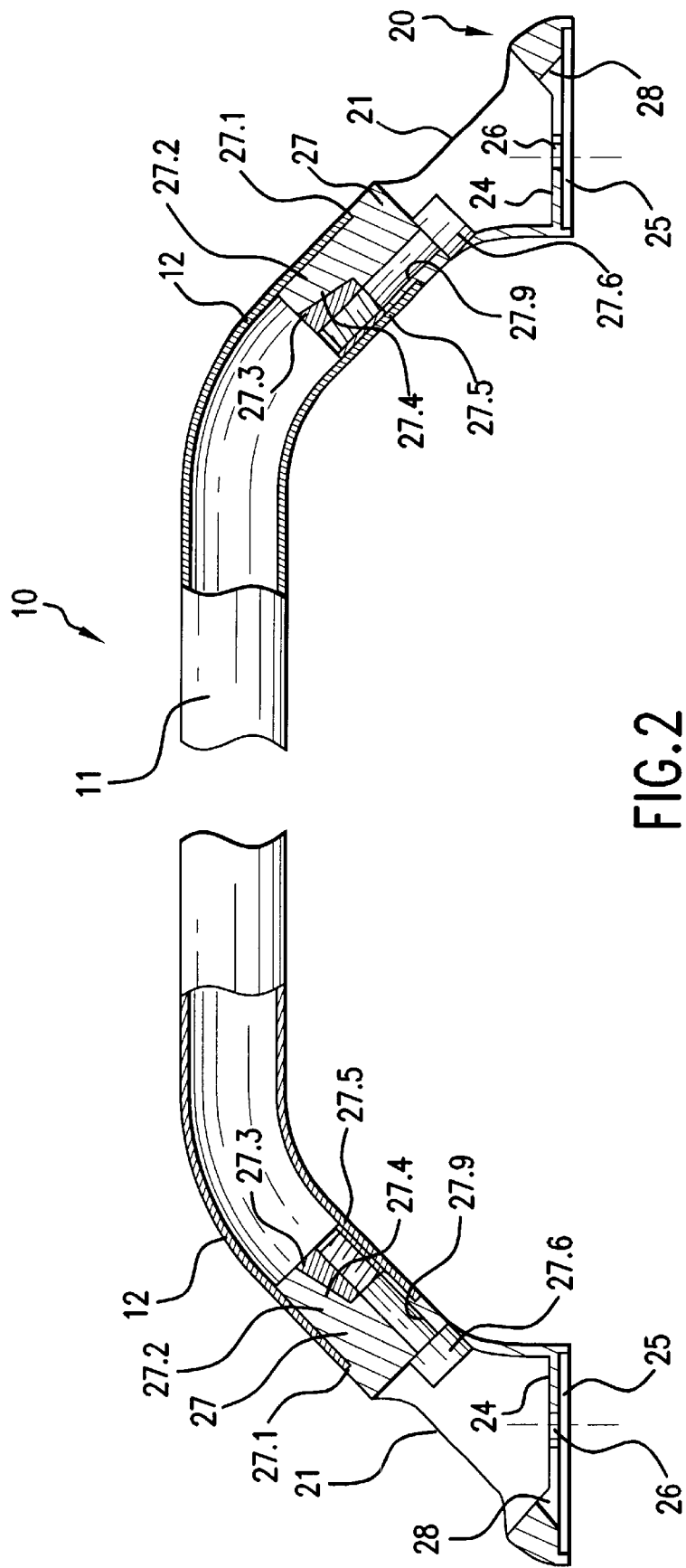
FIG. 2 is a partial sectional lateral view of one of the handles shown in FIG. 1.

A handle 10 is represented in a lateral view and partial section in FIG. 2. The handle 10 has a base handle element 11, which is embodied as a pipe section. The pipe section has a circular cross section. The use of non-circular cross sections, for example oval or angular, is also conceivable. End pieces 12 are bent 45° away from the ends of the base handle element 11.

Fastening elements 20 are used for fastening the handle 10 on the housing body 30. The fastening elements 20 have a fastening section 24, which is embodied to be plate-like. A screw receiver 26 is cut into the fastening section 24. Furthermore, a tool holding fixture 28 is recessed in the fastening section 24. On its side facing away from the base handle element 11, the fastening section 24 has a seal receiver 25. The side of the fastening section 24 facing the base handle element 11 is surrounded by an enclosure. This enclosure is accessible through an opening 21 and supports a clamping piece 27, which is used for connecting the base handle element 11. The clamping piece 27 has a protruding pin 27.2, which is inserted into the base handle element 11. The exterior cross section of the pin 27.2 is selected so that it can be inserted with slight play into the end pieces 12 of the base handle element 11. The insertion movement of the pin 27.2 into the end piece 12 is limited by means of a stop collar 27.1. The end of this stop collar 27.1 rests against the end piece 12. A screw receptacle 27.9, with a center longitudinal axis extending parallel with respect to the center longitudinal axis of the end piece 12, passes through the clamping piece 27. A fastening arrangement 27.6, embodied as a fastening screw, can be positioned within or conducted through the screw receptacle 27.9 and screwed into an adjusting member 27.3. The clamping piece 27 has an inclined face 27.4, on which an opposing face of the adjusting member 27.3 slides off. The inclined face 27.4 slopes with respect to the center longitudinal axis of the end piece 12. While tightening the fastening arrangement 27.6, the adjusting member 27.3 slides on the inclined face 27.4 and is displaced laterally outward and in the process contacts the interior face of the end piece 12 and rests with a pressure face 27.5 against this interior cross section. While further tightening the fastening arrangement 27.6, the adjusting member 27.3 and the pin 27.2 are braced in the end piece, so that the fastening element 20 is securely fixed in place. The fastening arrangement 27.6 can be adjusted either through the opening 21 or through the tool holding fixture 28.

As illustrated in FIG. 1, seals 23 are inserted into the seal receivers 25 of the fastening elements 20 for fastening the handle 10 on the housing body 30. The seals 23 have an adhesive layer on one side and can be glued to the underside of the fastening section 24. In this way the handle 10 is captively held, which offers advantages when mounting the handle 10. The handle 10 can be placed on the housing body 30 so that the screw receiver 26 of the fastening section 24 is aligned with the threaded receiver 35 of the lateral wall 32 or of the cover 31. A fastening screw 13 can be passed through the screw receiver 26 and screwed into the threaded receiver 35. The opening 21 of the fastening element 20 can subsequently be closed by a cover 22, so that the fastening screw 13 is no longer visibly unpleasant.

Figure 3:
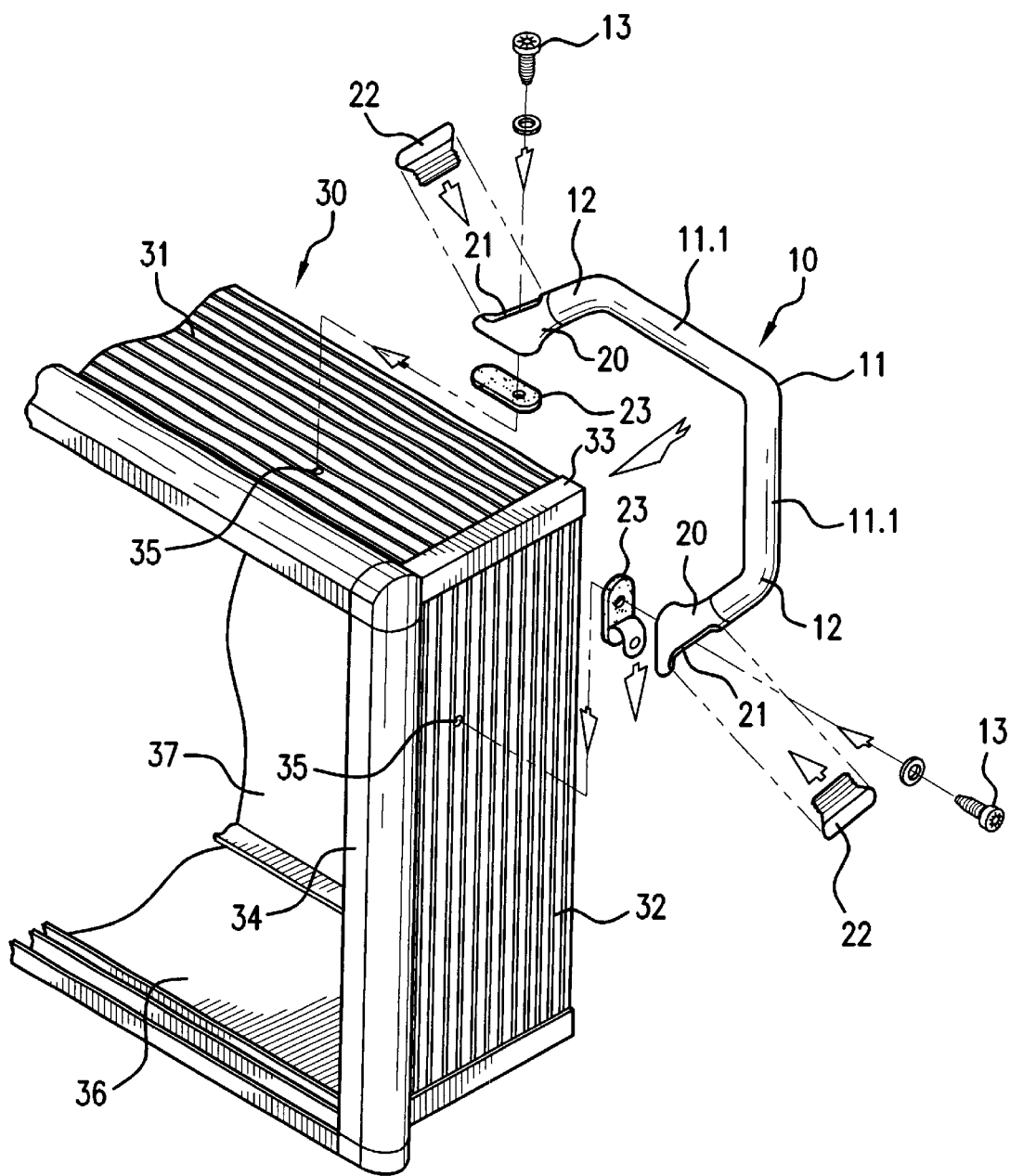
FIG. 3 is a partial representation of a housing in a perspective exploded plan view, with a handle extending around a housing edge.
Figure 4:
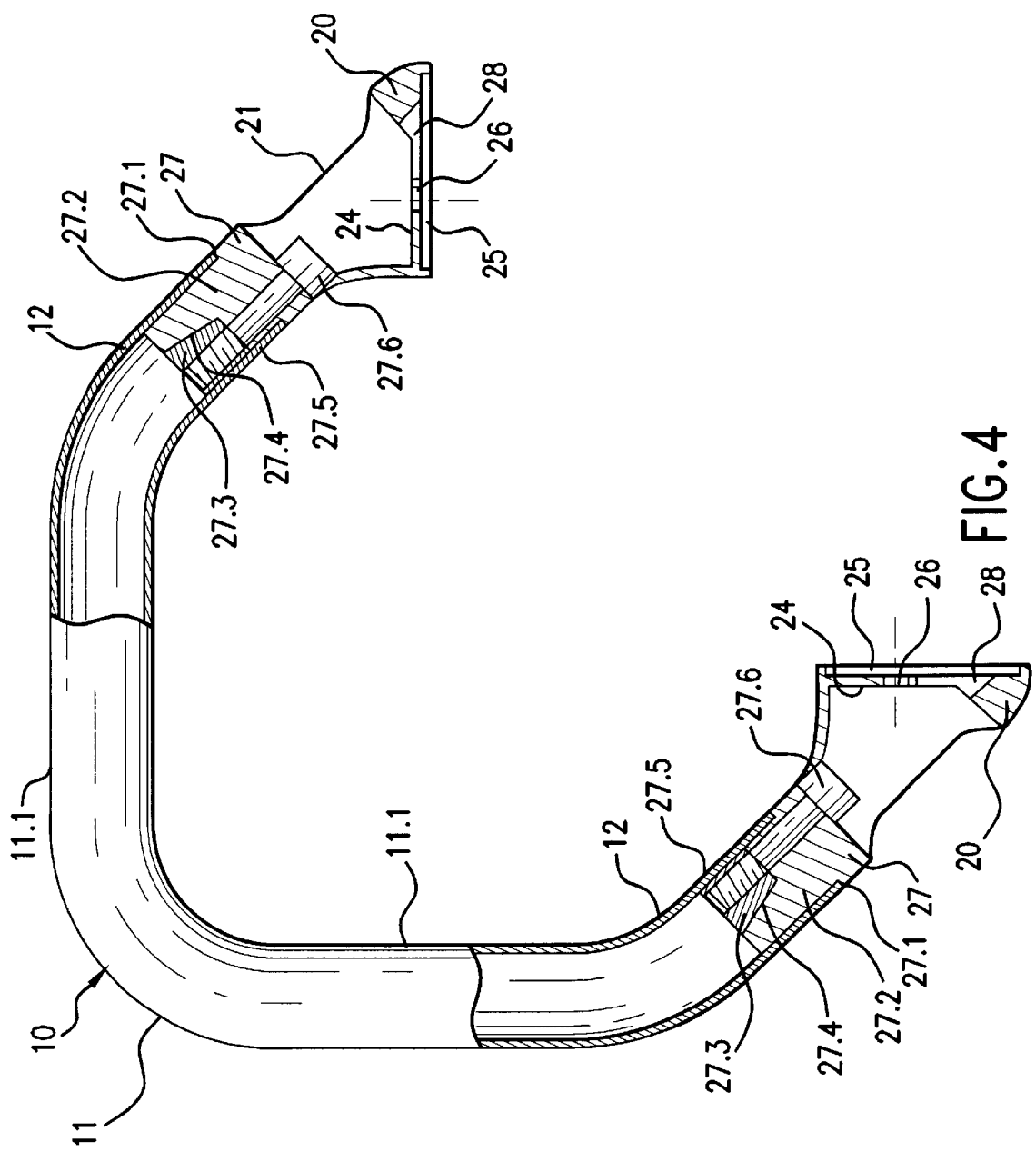
FIG. 4 is a partial sectional lateral view of the handle in accordance with FIG. 3.

An alternative embodiment variation of a handle 10 is represented in FIGS. 3 and 4. The base handle element 11 has two legs 11.1 extending at an angle in relation to each other, each of which has an end piece 12 on its free end. The previously described fastening element 20 is again inserted into the end element 12. The handle 10 is fastened by one fastening element 20 on the cover 31 and by the other fastening element 20 on the lateral wall 32, so that the base handle element 11 bridges a housing edge.

In a further design, the handle represented in FIGS. 3 and 4 can be restructured in such a way that it can also be installed on a flat surface. For this purpose the fastening elements 20 in the end pieces 12 are rotated 90° around the center longitudinal axis of the pipe pieces. The attachment faces of the fastening elements 20 are oriented with each other in so that they lie in a common plane. The fastening faces can then be placed on the flat surface, and the fastening elements 20 can be screwed to them. In this case the base handle element 11 projects at an angle of 45° from the flat surface.

What is claimed is:

1. In a housing for receiving electrical components, having a housing body with two lateral walls, a bottom and a cover, wherein a handle arrangement with at least one handle is fastened on an exterior of the housing body, wherein the handle has a base handle element with an end section on each of both ends to each of which a fastening element is connected, and wherein the fastening elements are connected with the housing body, the improvement comprising:

the base handle element (10) being one of a curved and a straight pipe section;

clamping pieces (27) of the fastening elements (20) inserted into the pipe section through open ends of the end sections (12);

the clamping pieces (27) having an adjusting member (27.3) adjustable with respect to the clamping piece (27) by a fastening arrangement (27.6); and the clamping piece (27) held in a braced position against an interior cross section of the pipe section by the adjusting member (27.3) and the fastening arrangement (27.6), the clamping pieces (27) each having an inclined face (27.4) on which the adjusting member (27.3) glides with an opposing face, and the inclined face (27.4) sloping with respect to a center longitudinal axis of the end sections (12).

2. In the housing in accordance with claim 1, wherein the adjusting member (27.3) has a threaded receiver with a thread axis extending one of parallel and aligned with respect to the center longitudinal axis of the related end section (12), the fastening element (20) has a screw receiver aligned with the threaded receiver, and a fastening screw designed as a fastening arrangement (27.6) positioned within the screw receiver and screwed into the threaded receiver.

3. In the housing in accordance with claim 2, wherein the fastening element (20) has a pin (27.2) inserted into one of the end sections (12) and outer contours matched to an interior cross section of one of the end sections (12), and a stop collar (27.1) is formed on one of the end sections (12) which in the inserted state of the pin (27.2) rests against an end of the end section (12).

4. In the housing in accordance with claim 3, wherein the fastening element (20) has a fastening section (24) with at least one second screw receiver (26), the fastening section (24) is surrounded at least in an area of the at least one second screw receiver (26) by an enclosure of the fastening element (20), the enclosure has an opening (21) for access to the at least one second screw receiver (26), and the opening (21) is closeable with a cover (22).

5. In the housing in accordance with claim 4, wherein the screw head of the fastening screw projects into an area of the enclosure and is accessible through at least one of the opening (21) and a tool holding fixture (28) of the fastening section (24).

6. In the housing in accordance with claim 5, wherein on a side facing the housing body (30) the fastening element (20) has a seal receiver (25) into which a seal (23) is inserted which is seated on one of the lateral walls, the cover and the bottom having a screw receiver (35), and which seals an area around the screw receiver (35).

7. In the housing in accordance with claim 6, wherein the base handle element (11) of the handle (10) extends parallel with respect to the related one of the lateral wall, the bottom and the cover of the housing body (30), the end sections (12) are bent away from the base handle element (11) in a direction toward the housing body, and flat fastening faces of the fastening elements rest on a wall of the housing body.

8. In the housing in accordance with claim 6, wherein the base handle element (11) has two legs (11.1) extending at right angles with respect to each other from each end of which one of the end sections (12) is bent off, and the fastening faces of the two fastening elements (20) are located at right angles to each other.

9. In the housing in accordance with claim 6, wherein the base handle element (11) has two legs extending (11.1) at right angles with respect to each other from each end of which one of the end sections (12) is bent off, and fastening faces of the two fastening elements (20) are aligned parallel with respect to each other and are located in a common plane.

10. In the housing in accordance with claim 1, wherein the fastening element (20) has a pin (27.2) inserted into one of the end sections (12) and outer contours matched to an interior cross section of one of the end sections (12), and said end section (12) having a stop collar (27.1), wherein said clamping piece rests against the stop collar (27.1) when the pin (27.7) is fully inserted into the end section (12).

11. In the housing in accordance with claim 1, wherein the base handle element (11) of the handle (10) extends parallel with respect to the related one of the lateral wall, the bottom and the cover of the housing body (30), the end sections (12) are bent away from the base handle element (11) in a direction toward the housing body, and flat fastening faces of the fastening elements rest on a wall of the housing body.

12. In the housing in accordance with claim 1, wherein the base handle element (11) has two legs extending (11.1) at right angles with respect to each other from each end of which one of the end sections (12) is bent off, and fastening faces of the two fastening elements (20) are aligned parallel with respect to each other and are located in a common plane.

13. In a housing for receiving electrical components, having a housing body with two lateral walls, a bottom and a cover, wherein a handle arrangement with at least one handle is fastened on an exterior of the housing body, wherein the handle has a base handle element with an end section on each of both ends to each of which a fastening element is connected, and wherein the fastening elements are connected with the housing body, the improvement comprising:

the base handle element (10) being one of a curved and a straight pipe section;

clamping pieces (27) of the fastening elements (20) inserted into the pipe section through open ends of the end sections (12);

the clamping pieces (27) having an adjusting member (27.3) adjustable with respect to the clamping piece (27) by a fastening arrangement (27.6); and the clamping piece (27) held in a braced position against an interior cross section of the pipe section by the adjusting member (27.3) and the fastening arrangement (27.6), the fastening element (20) having a fastening section (24) with at least one screw receiver (26), the fastening section (24) surrounded at least in an area of the screw receiver (26) by an enclosure of the fastening element (20), the enclosure having an opening (21) for access to the screw receiver (26), and the opening (21) closeable with a cover (22).

14. In a housing for receiving electrical components, having a housing body with two lateral walls, a bottom and a cover, wherein a handle arrangement with at least one handle is fastened on an exterior of the housing body, wherein the handle has a base handle element with an end section on each of both ends to each of which a fastening element is connected, and wherein the fastening elements are connected with the housing body, the improvement comprising:

the base handle element (10) being one of a curved and a straight pipe section;

clamping pieces (27) of the fastening elements (20) inserted into the pipe section through open ends of the end sections (12);

the clamping pieces (27) having an adjusting member (27.3) adjustable with respect to the clamping piece (27) by a fastening arrangement (27.6); and the clamping piece (27) held in a braced position against an interior cross section of the pipe section by the adjusting member (27.3) and the fastening arrangement (27.6), a screw head of a fastening screw projecting into an area of an enclosure surrounding a fastening section (24) of the fastening element (20) and accessible through at least one of an opening (21) of the fastening element (20) and a tool holding fixture (28) of the fastening section (24).

15. In a housing for receiving electrical components, having a housing body with two lateral walls, a bottom and a cover, wherein a handle arrangement with at least one handle is fastened on an exterior of the housing body, wherein the handle has a base handle element with an end section on each of both ends to each of which a fastening element is connected, and wherein the fastening elements are connected with the housing body, the improvement comprising:

the base handle element (10) being one of a curved and a straight pipe section;

clamping pieces (27) of the fastening elements (20) inserted into the pipe section through open ends of the end sections (12);

the clamping pieces (27) having an adjusting member (27.3) adjustable with respect to the clamping piece (27) by a fastening arrangement (27.6); and the clamping piece (27) held in a braced position against an interior cross section of the pipe section by the adjusting member (27.3) and the fastening arrangement (27.6), the fastening element (20) on a side facing the housing body (30) having a seal receiver (25) into which a seal (23) is inserted, the fastening element (20) seated on one of the lateral walls, the cover and the bottom, the lateral walls, cover and bottom having a screw receiver (35), and the seal (23) sealing an area around the screw receiver (35).

16. In a housing for receiving electrical components, having a housing body with two lateral walls, a bottom and a cover, wherein a handle arrangement with at least one handle is fastened on an exterior of the housing body, wherein the handle has a base handle element with an end section on each of both ends to each of which a fastening element is connected, and wherein the fastening elements are connected with the housing body, the improvement comprising:

the base handle element (10) being one of a curved and a straight pipe section;

clamping pieces (27) of the fastening elements (20) inserted into the pipe section through open ends of the end sections (12);

the clamping pieces (27) having an adjusting member (27.3) adjustable with respect to the clamping piece (27) by a fastening arrangement (27.6); and the clamping piece (27) held in a braced position against an interior cross section of the pipe section by the adjusting member (27.3) and the fastening arrangement (27.6), the base handle element (11) having two legs (11.1) extending at right angles with respect to each other from each end of which one of the end sections (12) is bent off, and fastening faces of the two fastening elements (20) located at right angles to each other.

* * * * *